United States Patent
Gardner et al.

(10) Patent No.: US 6,245,652 B1
(45) Date of Patent: Jun. 12, 2001

(54) METHOD OF FORMING ULTRA THIN GATE DIELECTRIC FOR HIGH PERFORMANCE SEMICONDUCTOR DEVICES

(75) Inventors: Mark I. Gardner, Cedar Creek; Dim-Lee Kwong; H. Jim Fulford, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/598,531

(22) Filed: Jun. 21, 2000

Related U.S. Application Data

(62) Division of application No. 09/148,017, filed on Sep. 4, 1998.

(51) Int. Cl.[7] ............... H01L 21/3205; H01L 21/337; H01L 21/8238; H01L 21/336; H01L 21/8234

(52) U.S. Cl. .................. 438/592; 438/594; 438/596; 438/197; 438/585; 438/216; 438/287; 438/261; 438/275; 438/591

(58) Field of Search ......................... 438/592, 594, 438/596, 197, 585, 216, 287, 261, 275, 591

(56) References Cited

U.S. PATENT DOCUMENTS

| | | | |
|---|---|---|---|
| 5,592,002 | 1/1997 | Kanamori | 257/321 |
| 5,811,865 * | 9/1998 | Hodges et al. | 257/411 |
| 5,834,353 | 11/1998 | Wu | 438/287 |
| 5,861,347 * | 1/1999 | Maiti et al. | 438/787 |
| 5,880,508 * | 3/1999 | Wu | 257/411 |
| 5,969,397 * | 10/1999 | Grider, III et al. | 257/410 |
| 5,972,751 | 10/1999 | Ramsbey et al. | 438/257 |
| 5,972,804 * | 10/1999 | Tobin et al. | 438/786 |
| 5,990,516 | 11/1999 | Momose et al. | 257/327 |
| 6,017,808 * | 1/2000 | Wang et al. | 438/528 |

FOREIGN PATENT DOCUMENTS

| | | | |
|---|---|---|---|
| 6-204465 | 7/1994 | (JP) | H01L/21/318 |

OTHER PUBLICATIONS

Momose et al., "Study of the manufacturing feasibility of 1.5–nm direct–tunneling gate oxide MOSFETs: uniformity, reliability, and dopant penetration of the gate oxide," *IEEE Transactions on Electron Devices*, vol. 45, No., 3, pp. 691–700, Mar. 1998.

Momose et al., "An improvement of hot carrier reliability in the stacked nitride–oxide gate n–and p–MISFET's," *IEEE Transactions on Electron Devices*, vol. 42, No. 4, pp. 704–712, Apr. 1995.

Momose et al., "Tunneling gate oxide approach to ultra–high current drive in small geometry MOSFET's," *Electron Devices Meeting Technical Digest*, pp. 593–596, Dec. 1994.

Yoon et al., "MOS characteristics of $NH_3$–nitrided $N_2O$–grown oxides," *IEEE Electron Device Letters*, vol. 14, No. 4, pp. 179–81, Apr. 1993.

\* cited by examiner

*Primary Examiner*—Matthew Smith
*Assistant Examiner*—Chuong A Luu
(74) *Attorney, Agent, or Firm*—Williams, Morgan & Amerson, P.C.

(57) ABSTRACT

The present invention is directed to a semiconductor device having an ultra thin, reliable gate dielectric and a method for making same. In one illustrative embodiment, the present method comprises forming a first layer of nitrogen doped silicon dioxide above a semiconducting substrate, reducing the thickness of the first layer, forming a second layer comprised of a material having a dielectric constant greater than seven above the first layer of silicon dioxide. The method further comprises forming a third layer comprised of a gate conductor material above the second layer, and patterning the first, second and third layers to define a gate conductor and a composite gate dielectric comprised of the first and second layers, and forming at least one source/drain region. The semiconductor device has a composite gate dielectric comprised of a first process layer comprised of a nitrogen doped oxide and a second process layer comprised of a material having a dielectric constant greater than seven. The device further comprises a gate conductor positioned above the composite gate dielectric, and at least one source/drain region formed in the substrate.

32 Claims, 2 Drawing Sheets

METHOD OF FORMING ULTRA THIN GATE DIELECTRIC FOR HIGH PERFORMANCE SEMICONDUCTOR DEVICES

This is a divisional of co-pending application Ser. No. 09/148,017, filed Sep. 4, 1998.

BACKGROUND OF THE INVENTION

1. Field of the Invention

The present invention is generally related to semiconductor processing, and, more particularly, to the manufacture transistors having ultra thin oxide layers.

2. Description of the Related Art

There is a constant drive within the semiconductor industry to increase the operating speed of integrated circuit devices, e.g., microprocessors, memory devices. etc. This drive is fueled by consumer demands for computers and electronic devices that operate at increasingly greater speeds. Generally, at least in the field of microprocessors, the larger the drive current through a transistor, the faster the transistor, and devices comprised of such transistors, will operate.

As is well known to those skilled in the art, the drive current is a function of, among other things, the voltage applied across the transistor. The operating voltage of modern semiconductor devices has continued to decrease over the years. One reason for the decrease in the operating voltage is that it reduces the amount of power consumed by the device when it is operating Reducing power consumption may be useful in many applications. e.g. portable computers, due to the limited life of the batteries used in such devices for power. However, while decreasing the operating voltage of modern semiconductor devices has reduced the power consumed by such devices, it has also, all other things being equal, resulted in a decrease in the drive current through the transistor. As stated above, reductions in the drive current through a transistor tend to reduce the ability of semiconductor devices. e.g., microprocessors, to operate at increasingly faster speeds. All other things being equal, one way to increase the drive current, and thus operating speed of semiconductor devices, is to reduce the thickness of the gate dielectric, typically a layer of silicon dioxide. Thus, there is a drive within the semiconductor industry to reduce the thickness of the gate dielectric layers used in semiconductor devices to increase the speed of operation of the device.

There are also other problems associated with modern gate dielectric layers used in integrated circuit devices. For example, in PMOS transistors, the gate conductor is typically doped with a $P^+$ dopant material such as boron. However, the boron dopant tends to penetrate the gate dielectric layer and the surface of the silicon substrate. One problem such penetration causes is it tends to lower the threshold voltage of the semiconductor device, thus making breakdown a greater possibility. Moreover, the boron penetration of the gate dielectric layer tends to degrade the quality of the gate dielectric. In effect, if there is enough boron penetration, the life of the transistor may be dramatically shortened. Additionally, for NMOS technology, hot carrier currents can be problematic. By way of background, hot carrier currents are electrons traveling between the source and drain of a transistor that pass through the gate oxide to the gate conductor. In effect, these hot carrier currents tunnel through the gate dielectric layer. This problem can also reduce the life expectancy of a semiconductor device.

The present invention is directed to a method and semiconductor device for solving some or all of the aforementioned problems.

SUMMARY OF THE INVENTION

The present invention is directed to a semiconductor device having an ultra thin, reliable gate dielectric and a method for making same. The method comprises forming a first process layer comprised of a gate dielectric material above the surface of a semiconducting substrate, and reducing the thickness of the first process layer. The method continues with the formation of a second process layer comprised of a material having a dielectric constant greater than seven above the first process layer, and forming a third process layer comprised of a gate conductor material above the second process layer. The method further comprises patterning the first, second and third process layers to define a gate conductor and a composite gate dielectric comprised of a portion of said first and second process layers, and forming at least one source/drain region in the substrate.

The present invention is also directed to a transistor comprised of a composite gate dielectric positioned above a semiconducting substrate, and a gate conductor positioned above the composite gate dielectric. The composite gate dielectric is comprised of a first process layer comprised of a nitrogen doped oxide positioned above the surface of the substrate, and a second process layer comprised of a material having a dielectric constant greater than seven positioned above the first process layer. The device further comprises at least one source/drain region formed in the substrate.

BRIEF DESCRIPTION OF THE DRAWINGS

The invention may be understood by reference to the following description taken in conjunction with the accompanying drawings, in which like reference numerals identify like elements, and in which.

Figure 1:
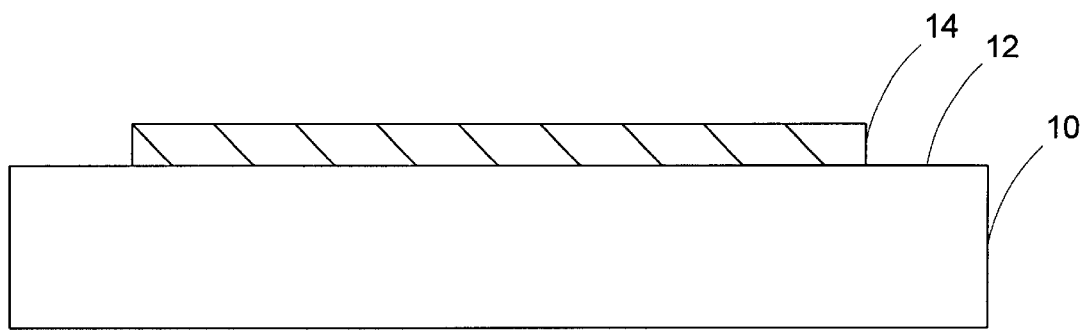
FIG. 1 is a cross-sectional view of a semiconducting substrate with a process layer formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for to those of ordinary skill in the art having the benefit of this disclosure.

The present invention will now be described with reference to FIGS. 1–4. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards a semiconductor device, e.g., a transistor, having a very thin, high quality gate dielectric, and a method for making same. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As shown in FIG. 1, a process layer 14 is formed above a surface 12 of a semiconducting substrate 10. In one illustrative embodiment, the semiconducting substrate 10 is comprised of silicon. Of course, as used herein, the term "substrate" would also include any epitaxial layer of semiconducting material. The process layer 14 may be comprised of a nitrogen bearing, or nitrogen doped, oxide, e.g., silicon dioxide, oxynitride, etc., having a thickness ranging from approximately 5–10 Å. In one illustrative embodiment, the process layer 14 is comprised of a layer of nitrogen bearing silicon dioxide.

The illustrative process layer 14 comprised of nitrogen bearing silicon dioxide may be formed by thermally growing the process layer 14 in the presence of, for example, nitric oxide (NO) or nitrous oxide ($N_2O$), or a combination of both. For example, the process layer 14 may be grown by a rapid thermal anneal process at a temperature ranging from approximately 700–900° C. in the presence of nitric oxide (NO), nitrous oxide ($N_2O$) (or combinations of both) for approximately 10–30 seconds. In one illustrative embodiment, the process layer 14 is comprised of nitrogen bearing silicon dioxide grown by a rapid thermal anneal process at a temperature of approximately 800° C. for 20 seconds in the presence of nitric oxide (NO). As those skilled in the art will recognize, the presence of nitric oxide or nitrous oxide during the oxidation process tends to reduce the oxidation rate, thereby allowing the process layer 14 to be grown thinner than if it were grown in the presence of oxygen. The process layer 14 could also be formed by a plasma deposition process at a temperature ranging from 100–350° C. for approximately 30–120 seconds.

Thereafter, if desired, the thickness of the process layer 14 may be reduced by, for example, a dilute acid wet etching process. In one illustrative embodiment of the present invention, a thermally grown process layer 14 comprised of silicon dioxide, or a nitrogen bearing oxide, having an as formed thickness ranging from approximately 5–10 Å may be reduced to approximately 3–5 Å by subjecting the process layer 14 to a dilute hydrofluoric acid wet etching process (at a concentration of approximately 100:1). This specific etch chemistry has a removal rate (for silicon dioxide) of approximately 0.5 Å/second. Of course, other etch chemistries may be employed to thin the as formed process layer 14.

Figure 2:
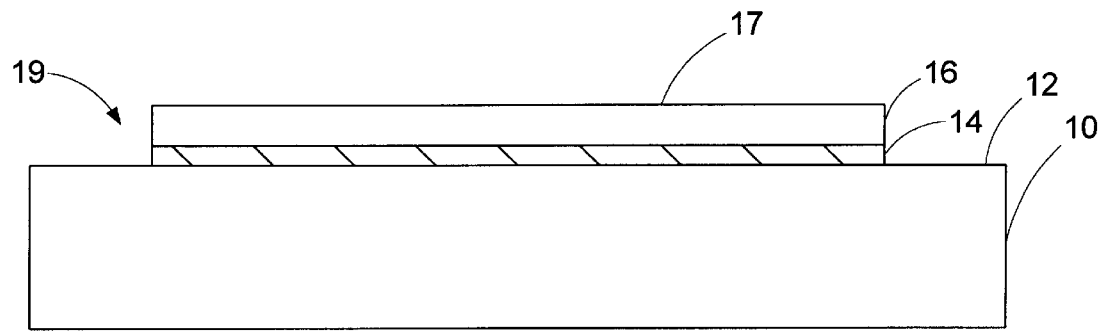
FIG. 2 is a cross-sectional view of the device depicted in FIG. 1 with another process layer formed thereabove.

Next, as shown in FIG. 2, a process layer 16 is formed above the process layer 14. The process layer 16 may be comprised of a variety of materials, such as silicon nitride, tantalum pentoxide, titanium oxide, barium strontium titanate (BST), or any dielectric material having a dielectric constant greater than 7. The process layer 16 may be formed by a variety of techniques, such as low pressure chemical vapor deposition (LPCVD), remote plasma deposition, etc., and may have a thickness ranging from approximately 15–25 Å. Of course, the process layer 16 may be made thicker if warranted by a particular application.

In one illustrative embodiment, the process layer 16 is comprised of silicon nitride formed by an LPCVD process at a temperature ranging from 700–900° C. and at a pressure ranging from approximately 1–2 Torr for 10–20 seconds. The illustrative process layer 16 comprised of silicon nitride may be formed using silane ($SiH_4$) or dichlorosilane ($Si_2H_2Cl_2$) in combination with ammonium ($NH_3$), or other like materials. In one illustrative embodiment, the process layer 16 comprised of silicon nitride is deposited by using a combination silane/ammonium ($SiH_4/NH_3$) at a ratio of 1/40 at a temperature of approximately 800° C., at 1.5 Torr, and for approximately 15 seconds. Of course, the concentration of the silane and ammonium may be varied such that the ratio ranges between approximately 1/30–1/50. Additionally, the process layer 16 comprised of silicon nitride may also be deposited by using a combination of dichlorosilane ($Si_2H_2Cl_2$) and ammonium ($NH_3$) in a similar range of concentrations.

The process layer 14 and process layer 16 shown in FIG. 2 collectively comprise a composite gate dielectric 19. In the illustrative example where the process layer 14 is comprised of approximately 3–5 Å of a nitrogen bearing silicon dioxide (after the thinning process described above), and the process layer 16 is comprised of silicon nitride, the two layers combined have an equivalent oxide thickness of approximately 10.5 Å. That is, the 15–25 Å layer of silicon nitride having a dielectric constant of approximately 8 is equivalent to approximately 7.5–12.5 Å of silicon dioxide that has a dielectric constant of approximately four. In total, the combination of the illustrative process layers 14, 16 have a combined equivalent oxide thickness ranging from 10.5–17.5 Å. Thus, the present invention allows significant reduction in the thickness of the gate dielectric.

After the process layer 16 is formed as indicated in FIG. 2, the process layer 16 may be subjected to a rapid heat treating process in the presence of nitrogen, i.e., a rapid thermal nitridation process. For example, this heat treatment may be performed in the presence of pure ammonium ($NH_3$), nitric oxide (NO) or nitrous oxide ($NO_2$), or combinations thereof, at temperatures ranging from approximately 800–1000° C. In one illustrative embodiment, the process layer 16 comprised of silicon nitride is subjected to a rapid thermal anneal process in the presence of pure ammonium ($NH_3$) at a temperature ranging from 800–1000° C. for approximately 10–45 seconds, and, in one particular embodiment, at a temperature of approximately 950° C. for 30 seconds. This process may also be accomplished in a tube furnace at a temperature of approximately 900–1000° C. for 1–5 minutes. The purpose of subjecting the process layer 16 to this heat treating process in the presence of nitrogen is to densify the illustrative process layer 16 comprised of silicon nitride to passivate the traps within the process layer 16.

Figure 3:
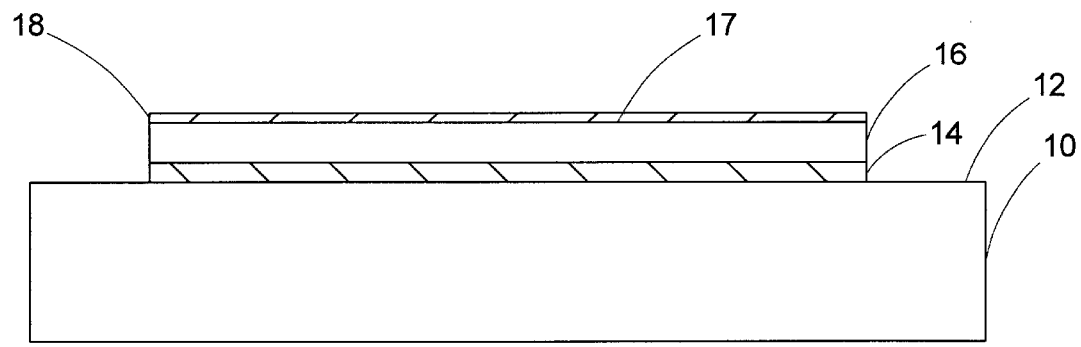
FIG. 3 is a cross-sectional view of the device depicted in FIG. 2 after being subjected to an optional heat treating process.

Thereafter, as shown in FIG. 3, the semiconductor device can be subjected to an optimal final heat treatment at a range of 800–1000° C. for 15–45 seconds. This final heat treating process is carried out in the presence of nitric oxide, nitrous oxide, or combinations of both. In the illustrative embodiment, when the process layer 16 is comprised of silicon nitride, this final heat treatment results in the formation of a layer 18 of silicon oxynitride above the surface 17 of the process layer 16. Of course, in the case when the process layer 16 is comprised of other possible materials, e.g., tantalum pentoxide, the layer 18 may be a different material than silicon oxynitride.

In one illustrative embodiment involving a process layer 16 comprised of silicon nitride, this final heat treating process may be performed by a rapid thermal anneal process at a temperature of approximately 900° C. for approximately 30 seconds in the presence of nitrous oxide ($N_2O$). This results in a layer 18 having a thickness of less than approximately 3 Å.

If desired, the layer 18 may be subsequently removed by, for example, a dilute acid wet etching process (similar to the one described above for thinning the process layer 14), a plasma etching process, or other similar processes known to those skilled in the art. It should be noted that subjecting the process layer 16 to this last heat treating process and forming the layer 18 is not required to practice the present invention. However, semiconductor devices in which the process layer 16 comprised of silicon dioxide has been subjected to this post re-oxidation process at approximately 900° C. in the presence of $N_2O$ have shown higher drain currents in the control devices for both PMOS and NMOS transistors. Formation of the layer 18 also tends to reduce the electron traps in the process layer 16. Additionally, if desired, the process layer 18 may be subsequently removed (by, for example, a wet or dry etching process) to further reduce the equivalent oxide thickness of the layers 14, 16 formed above the substrate 10.

Figure 4:
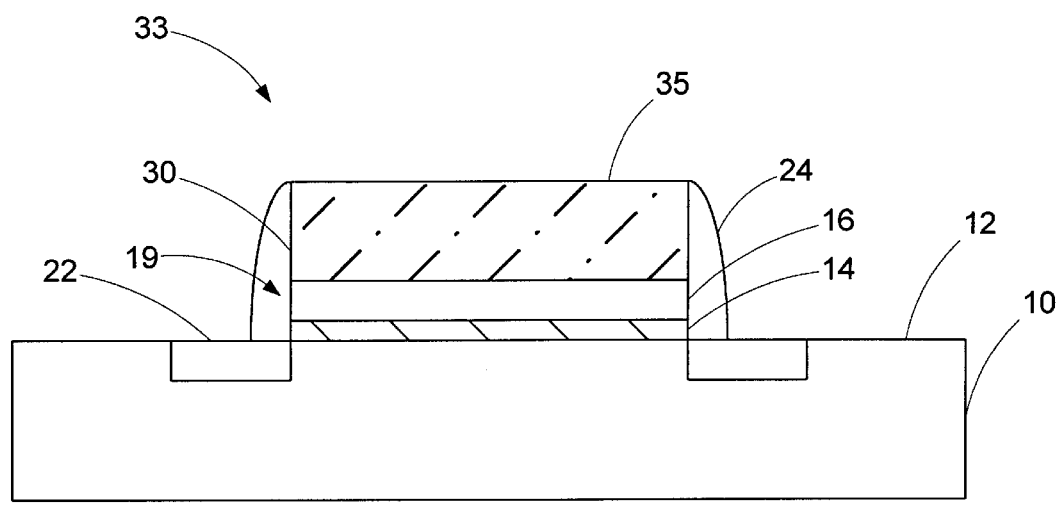
FIG. 4 is a cross-sectional view of an illustrative transistor in accordance with the present invention.

Thereafter, normal processing may continue to form an illustrative transistor 33 shown in FIG. 4 (note that optional process layer 18 is omitted for this drawing). For example, a process layer 35 comprised of a gate conductor material, such as polysilicon, may be formed above the process layer 16. Thereafter, the process layer 35 and the composite gate dielectric 19, comprised of the process layers 14, 16, may be patterned to form the gate conductor 30 and gate dielectric 28, respectively. Thereafter, the sidewall spacers 24 may be formed adjacent the gate conductor 30 and source/drain regions may be formed in the substrate 10.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device above a semiconducting substrate, said substrate having a surface, comprising:

forming a first process layer comprised of a gate dielectric material above said surface of said substrate, said first process layer having a thickness;

reducing the thickness of said first process layer;

forming a second process layer comprised of a gate dielectric material above said first process layer;

forming a third process layer comprised of a gate conductor material above said second process layer;

patterning said first, second and third process layers to define a gate conductor and a composite gate dielectric, said composite gate dielectric comprised of a portion of said first and second process layers; and forming at least one source/drain region.

2. The method of claim 1, wherein forming a first process layer comprised of a gate dielectric material above said surface of said substrate, said first process layer having a thickness, comprises forming a first process layer comprised of a nitrogen bearing oxide above said surface of said substrate, said first process layer having a thickness.

3. The method of claim 1, wherein forming a first process layer comprised of a gate dielectric material above said surface of said substrate, said first process layer having a thickness, comprises forming a first process layer comprised of silicon dioxide above said surface of said substrate, said first process layer having a thickness.

4. The method of claim 1, wherein reducing the thickness of said first process layer comprises reducing the thickness of said first process layer by an etching process.

5. The method of claim 1, wherein reducing the thickness of said first process layer comprises reducing the thickness of said first process layer by a wet etching process.

6. The method of claim 1, wherein forming a second process layer comprised of a gate dielectric material above said first process layer comprises forming a second process layer comprised of a gate dielectric material having a dielectric constant greater than seven above said first process layer.

7. The method of claim 1, wherein forming a third process layer comprised of a gate conductor material above said second process layer comprises forming a third process layer comprised of polysilicon above said second process layer.

8. The method of claim 1, wherein forming a second process layer comprised of a gate dielectric material above said first process layer comprises depositing a second process layer comprised of silicon nitride above said first process layer, said second process layer deposited at a temperature ranging from approximately 700–900° C. and a pressure ranging from approximately 1–2 Torr.

9. The method of claim 1, wherein forming a second process layer comprised of a gate dielectric material above said first process layer comprises forming a second process layer comprised of silicon nitride above said first process layer using a combination of silane ($SiH_4$) or dichlorosilane ($Si_2H_2Cl_2$) and ammonium at a ratio ranging from approximately 1/30–1/50.

10. The method of claim 9, wherein forming a second process layer comprised of silicon nitride comprises forming said second process layer at a temperature ranging from approximately 700–900° C. and at a pressure ranging from 1–2 Torr.

11. The method of claim 9 wherein forming a second process layer comprised of silicon nitride comprises forming said second process layer at a temperature of approximately 800° C. at approximately 1.5 Torr.

12. The method of claim 1, further comprising heat treating said second process layer in the presence of nitrogen at a temperature ranging from approximately 800–1000° C. for a time period ranging from approximately 10–45 seconds.

13. The method of claim 1, further comprising heat treating said second process layer in the presence of ammonium at a temperature ranging from approximately 800–1000° C. for a time period ranging from approximately 10–45 seconds.

14. The method of claim 1, further comprising heat treating said second process layer in the presence of nitric oxide, nitrous oxide, or a combination of both, at a temperature ranging from approximately 800–1000° C. for approximately 15–45 seconds.

15. The method of claim 1, further comprising heat treating said second process layer in the presence of nitrous oxide at a temperature ranging from approximately 800–1000° C. for approximately 15–45 seconds.

16. The method of claim 1, wherein forming a first process layer comprised of a gate dielectric material above said surface of said substrate, said first process layer having a thickness, comprises forming a first process layer comprised of a nitrogen bearing oxide formed in the presence of nitric oxide, nitrous oxide, or a combination of both, at a temperature ranging from approximately 700–900° C. above said surface of said substrate, said first process layer having a thickness.

17. The method of claim 1, wherein forming a first process layer comprised of a gate dielectric material above said surface of said substrate, said first process layer having a thickness, comprises forming a first process layer comprised of a nitrogen bearing oxide formed in the presence of nitrous oxide at a temperature ranging from approximately 700–900° C. above said surface of said substrate said first process layer having a thickness.

18. A method of forming a semiconductor device above a semiconducting substrate, said substrate having a surface, comprising:

forming a first process layer comprised of a nitrogen bearing oxide above said surface of said substrate, said first process layer having a thickness;

reducing the thickness of said first process layer after it is initially formed;

forming a second process layer comprised of a gate dielectric material above said first process layer;

forming a third process layer comprised of a gate conductor material comprised of polysilicon above said second process layer;

patterning said first, second and third process layers to define a gate conductor and a composite gate dielectric, said composite gate dielectric comprised of a portion of said first and second process layers; and forming at least one source/drain region.

19. The method of claim 18, wherein forming a first process layer comprised of a nitrogen bearing oxide above said surface of said substrate, said first process layer having a thickness, comprises forming a first process layer comprised of a nitrogen bearing oxide formed in the presence of nitric oxide, nitrous oxide, or a combination of both, at a temperature ranging from approximately 700–900° C. above said surface of said substrate, said first process layer having a thickness.

20. The method of claim 18, wherein forming a first process layer comprised of a nitrogen bearing oxide above said surface of said substrate, said first process layer having a thickness, comprises forming a first process layer comprised of a nitrogen bearing oxide formed in the presence of nitrous oxide at a temperature ranging from approximately 700–900° C. above said surface of said substrate, said first process layer having a thickness.

21. The method of claim 18, wherein forming a first process layer comprised of a nitrogen bearing oxide above said surface of said substrate, said first process layer having a thickness, comprises forming a first process layer comprised of a nitrogen bearing oxide formed in the presence of nitrous oxide at a temperature ranging from approximately 700–900° C. and during a time period ranging from approximately 10–30 seconds above said surface of said substrate, said first process layer having a thickness.

22. The method of claim 18, wherein reducing the thickness of said first process layer after it is initially formed comprises reducing the thickness of said first process layer by an etching process.

23. The method of claim 18, wherein reducing the thickness of said first process layer after it is initially formed comprises reducing the thickness of said first process layer by a dilute acid wet etching process.

24. The method of claim 18, wherein forming a second process layer comprised of a gate dielectric material above said first process layer comprises forming a second process layer comprised of a gate dielectric material having a dielectric constant greater than seven above said first process layer.

25. The method of claim 18, wherein forming a second process layer comprised of a gate dielectric material above said first process layer comprises depositing a second process layer comprised of silicon nitride above said first process layer, said second process layer deposited at a temperature ranging from approximately 700–900° C. and a pressure ranging from approximately 1–2 Torr.

26. The method of claim 18, wherein forming a second process layer comprised of a gate dielectric material above said first process layer comprises forming a second process layer comprised of silicon nitride above said first process layer using a combination of silane ($SiH_4$) or dichlorosilane ($Si_2H_2Cl_2$) and ammonium at a ratio ranging from approximately 1/30–1/50.

27. The method of claim 26, wherein forming a second process layer comprised of silicon nitride comprises forming said second process layer at a temperature ranging from approximately 700–900° C. and at a pressure ranging from 1–2 Torr.

28. The method of claim 26, wherein forming a second process layer comprised of silicon nitride comprises forming said second process layer at a temperature of approximately 800° C. at approximately 1.5 Torr.

29. The method of claim 18, further comprising heat treating said second process layer in the presence of nitrogen at a temperature ranging from approximately 800–1000° C. for a time period ranging from approximately 10–45 seconds.

30. The method of claim 18, further comprising heat treating said second process layer in the presence of ammonium at a temperature ranging from approximately 800–1000° C. for a time period ranging from approximately 10–45 seconds.

31. The method of claim 18, further comprising heat treating said second process layer in the presence of nitric oxide, nitrous oxide, or a combination of both, at a temperature ranging from approximately 800–1000° C. for approximately 15–45 seconds.

32. The method of claim 18, further comprising heat treating said second process layer in the presence of nitrous oxide at a temperature ranging from approximately 800–1000° C. for approximately 15–45 seconds.

* * * * *